United States Patent
Bozorgi et al.

(10) Patent No.: US 9,688,533 B2
(45) Date of Patent: Jun. 27, 2017

(54) USING MILLISECOND PULSED LASER WELDING IN MEMS PACKAGING

(75) Inventors: Payam Bozorgi, Santa Barbara, CA (US); Noel C. MacDonald, Santa Barbara, CA (US)

(73) Assignee: The Regents of the University of California, Oakland, CA (US)

( * ) Notice: Subject to any disclaimer, the term of this patent is extended or adjusted under 35 U.S.C. 154(b) by 241 days.

(21) Appl. No.: 13/982,427

(22) PCT Filed: Jan. 31, 2012

(86) PCT No.: PCT/US2012/023303
§ 371 (c)(1),
(2), (4) Date: Jan. 21, 2014

(87) PCT Pub. No.: WO2012/106326
PCT Pub. Date: Aug. 9, 2012

(65) Prior Publication Data
US 2014/0126167 A1    May 8, 2014

Related U.S. Application Data

(60) Provisional application No. 61/437,936, filed on Jan. 31, 2011.

(51) Int. Cl.
*H05K 7/00* (2006.01)
*B81C 3/00* (2006.01)
(Continued)

(52) U.S. Cl.
CPC .......... *B81C 3/001* (2013.01); *B23K 26/0622* (2015.10); *B23K 26/206* (2013.01);
(Continued)

(58) Field of Classification Search
CPC ....... H01L 2924/00; H01L 2924/01322; H01L 2924/1461; H01L 21/50; H01L 23/10;
(Continued)

(56) References Cited

U.S. PATENT DOCUMENTS 5,938,952 A * 8/1999 Lin ................ B23K 26/032
219/121.63
2003/0010808 A1 * 1/2003 Uhland ............. A61K 9/0097
228/110.1
(Continued)

FOREIGN PATENT DOCUMENTS

WO    WO2010036442    * 4/2010

OTHER PUBLICATIONS

Tachibana, H., et al., "Vacuum Wafer Level Packaged Two-Dimensional Optical Scanner by Anodic Bonding", IEEE MEMS 2009, Sorrento, Italy.
(Continued)

*Primary Examiner* — Yuriy Semenenko
(74) *Attorney, Agent, or Firm* — Gates & Cooper LLP

(57) ABSTRACT

A new packaging method for a wide range of MEMS for application on both the wafer and device scale. Titanium is used as the packaging material and both silicon and titanium MEMS devices are integrated on to a titanium substrate. A Nd:YAG pulsed laser is used to micro-weld the titanium cap to the substrate. A three-dimensional time dependent model of heat flow during laser beam welding is presented. The heat transfer and parametric design capabilities of COMSOL were employed for this purpose. Model calculations are compared and calibrated with experimental results of pulsed laser welds. The functionality and hermiticity of the proposed packaging was evaluated by packaging a self actuated Veeco Instrument AFM cantilever tip. The experimental measurements show that the resonance frequency and qual-
(Continued)

ity factor of the device stay the same before and after packaging and the applied technique has no effect on the device.

19 Claims, 14 Drawing Sheets

(51) Int. Cl.
*B81C 1/00* (2006.01)
*H01L 21/50* (2006.01)
*H01L 23/10* (2006.01)
*B23K 26/20* (2014.01)
*B23K 26/24* (2014.01)
*H05K 1/18* (2006.01)
*B23K 26/32* (2014.01)
*B23K 26/0622* (2014.01)
*H01L 23/00* (2006.01)
*B23K 103/14* (2006.01)

(52) U.S. Cl.
CPC .............. *B23K 26/24* (2013.01); *B23K 26/32* (2013.01); *B81C 1/00269* (2013.01); *H01L 21/50* (2013.01); *H01L 23/10* (2013.01); *H05K 1/18* (2013.01); *B23K 2203/14* (2013.01); *B81C 2203/0118* (2013.01); *B81C 2203/038* (2013.01); *H01L 24/97* (2013.01); *H01L 2924/01019* (2013.01); *H01L 2924/01065* (2013.01); *H01L 2924/01322* (2013.01); *H01L 2924/12041* (2013.01); *H01L 2924/12042* (2013.01); *H01L 2924/1461* (2013.01)

(58) Field of Classification Search
CPC ........... H01L 24/97; H01L 2924/01019; H01L 2924/01065; H01L 2924/12041; B23K 2203/14; B23K 26/063; B23K 26/206; B23K 26/24
USPC ............... 361/729, 736, 748, 760, 761, 764; 257/415, 704, 53; 228/110.1
See application file for complete search history.

(56) References Cited

U.S. PATENT DOCUMENTS

| 2003/0015768 | A1  | 1/2003  | Bosco et al. |  |
|---|---|---|---|---|
| 2006/0157103 | A1* | 7/2006  | Sheats ................. | H01L 27/3204 136/244 |
| 2006/0197215 | A1* | 9/2006  | Potter ................. | B81C 1/00269 257/704 |
| 2006/0220223 | A1* | 10/2006 | Lu ........................ | B81C 1/00269 257/704 |
| 2008/0188064 | A1* | 8/2008  | Samuelson ............ | B82Y 10/00 438/488 |
| 2008/0217312 | A1  | 9/2008  | Tokura |  |
| 2011/0018076 | A1* | 1/2011  | Pahl ....................... | B81B 7/0061 257/415 |
| 2011/0018117 | A1* | 1/2011  | Yang ....................... | H01L 24/11 257/690 |
| 2011/0139484 | A1* | 6/2011  | Koester .................. | A61N 1/375 174/50.56 |

OTHER PUBLICATIONS

Mitchell, J.S., et al., "A Detailed Study of Yield and Reliability for Vacuum Packages Fabricated in a Wafer-Level Au—Si Eutectic Bonding Process", Transducers 2009, Denver, Colorado.
Aimi, M.F., et al., "High-aspect-ratio bulk micromachining of titanium", Nature Materials, Feb. 2004, vol. 3., www.nature.com/naturematerials.
Brunette. D., et al., "Titanium in Medicine", Springer, 2001.
Cline, H.E., et al., "Heat treating and melting material with a scanning laser or electron beam", Journal of Applied Physics, Sep. 1977, vol. 48, No. 9.
Klemens, P.G., "Heat balance and flow conditions for electron beam and laser welding", Journal of Applied Physics, May 1976, vol. 47, No. 5.
Dowden, J., et al., "An analysis of the laser-plasma interaction in keyhole welding", J. Phys. D: Appl. Phys., 1989, pp. 741-749, vol. 22.
Vishnu, P.R., et al., "Heat flow model for pulsed welding", Materials Science and Technology, Jul. 1991, pp. 649-659, vol. 7., No. 7.
Kaplan, A.F.G., "A model of deep penetration laser welding based on calculation of the keyhole profile", J. Phys. D: Appl. Phys, 1994, pp. 1805-1814, vol. 27.
Tokarev, Vladimir, et al., "An analytical modeling of time dependent pulsed laser melting", Journal of Applied Physics, Sep. 1, 1999, pp. 2836-2847, vol. 86, No. 5.
Donachie, Matthew, J., Jr., "Titanium: A Technical Guide—Second Edition", ASM International, 1994, pp. 27-28.
Dahotre, N.B., et al., "Laser Fabrication and Machining of Materials", Springer Science, 2008, pp. 4-9.
Duley, Walter W., "Laser Welding", John Wiley and Sons, 1999.
PCT International Search Report and Written Opinion dated May 21, 2012 for PCT Application No. PCT/US2012/023303.
Bozorgi, P., et al.,"Application of Millisecond Pulsed Laser Welding in MEMS Packaging".

* cited by examiner

350 MICRONS

FIG. 8A 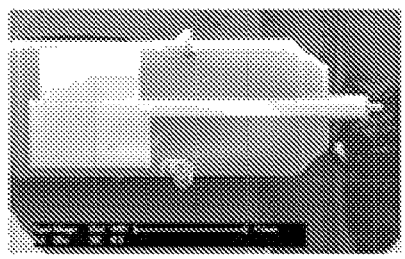 FIG. 8B 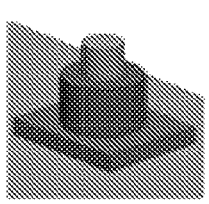 FIG. 8C 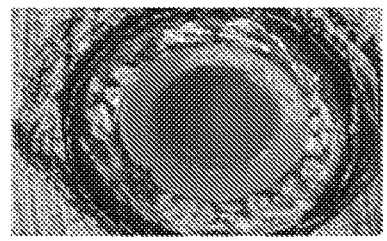
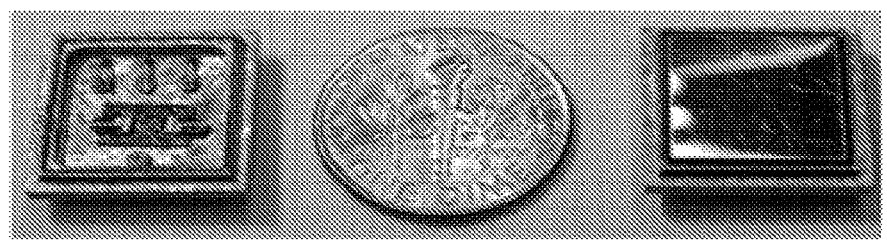
FIG. 8D
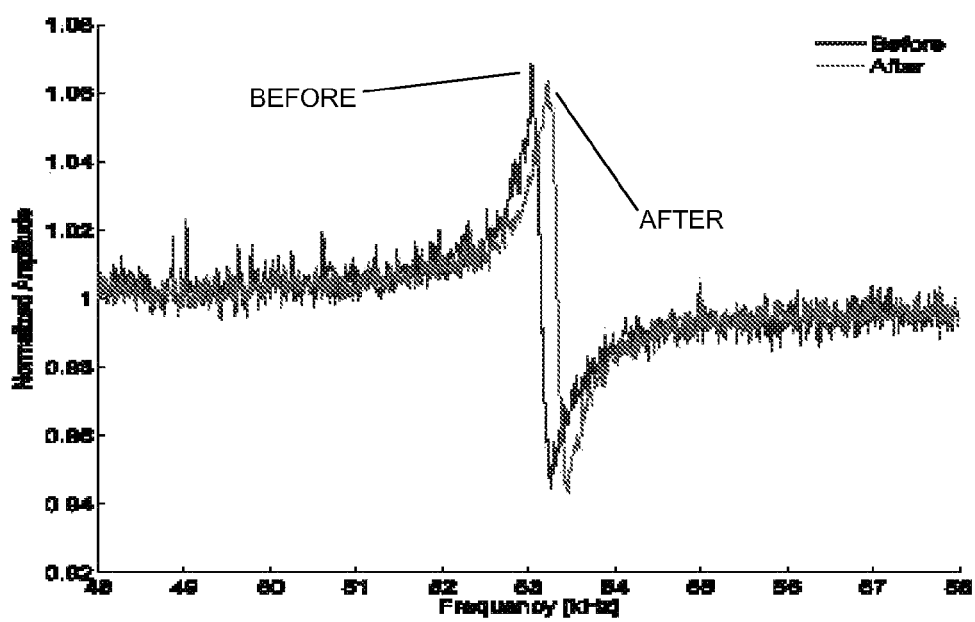
FIG. 8E
FIG. 8

USING MILLISECOND PULSED LASER WELDING IN MEMS PACKAGING

CROSS-REFERENCE TO RELATED APPLICATIONS

This application claims the benefit under 35 U.S.C. Section 119(e) of co-pending and commonly-assigned U.S. Provisional Patent Application Ser. No. 61/437,936, filed on Jan. 31, 2011, by Payam Bozorgi and Noel C. MacDonald, entitled "USING MILLISECOND PULSED LASER WELDING IN MEMS PACKAGING," which application is incorporated by reference herein.

STATEMENT REGARDING FEDERALLY SPONSORED RESEARCH AND DEVELOPMENT

This invention was made with Government support under Grant/Contract No. W9113M-04-01-0001 awarded by the U.S. Army Space and Missile Command. The Government has certain rights in this invention.

BACKGROUND OF THE INVENTION

1. Field of the Invention

The present invention relates to micro-electro-mechanical system (MEMS) packaging.

2. Description of the Related Art (Note: This application references a number of different publications as indicated throughout the specification by one or more reference numbers within brackets, e.g., [x]. A list of these different publications ordered according to these reference numbers can be found below in the section entitled "References." Each of these publications is incorporated by reference herein.)

Packaging provides structural and environmental protection for MEMS devices to enhance their reliability but poses a critical challenge for the commercialization of MEMS products. Techniques that are compatible with wafer level fabrication, low temperature processing, vacuum and hermetic encapsulation, scalable and standard MEMS post-fabrication approaches are needed in many applications.

Although Au—Au and Si—Au eutectic bonding [1] and anodic bonding [2] have been widely used in MEMS packaging, these global heating packaging approaches still have several drawbacks. They are not reproducible, have surface and intermediate film dependency, and require various high temperature steps for bonding. As such, no temperature sensitive material survives through the bonding process.

Titanium has been studied as a new material to produce MEMS [3] because of titanium's excellent biocompatibility, corrosion resistance, high strength-to-weight ratio, weldability [4] and potential in vivo applications in biotechnology [5]. Many micro and nano-fabrication processes on titanium have been developed thus far but as of today no reliable method to package titanium based MEMS has been reported.

It can be seen, then, that there is a need in the art for techniques to integrate titanium into MEMS. It can also be seen that there is a need in the art for techniques that avoid global heating of the MEMS packaging.

SUMMARY OF THE INVENTION

The present invention describes the use of titanium as a MEMS packaging material and the use of a pulsed laser to locally heat and micro-weld a titanium cap to the substrate. The method of the present invention addresses the drawbacks of the current packaging techniques such as eutectic and anodic bonding approaches.

Laser welding in the present invention refers to the low repetition rate regime in which significant re-solidification of work piece occurs between laser pulses. Pulsed laser welding offers the advantage of very local heat input to the weld, resulting in low distortion and the ability to package the heat sensitive electronic components in device and wafer level.

An apparatus in accordance with one or more embodiments of the present invention comprises a substrate, a micro-electro-mechanical system (MEMS), coupled to the substrate, and a cap, laser welded to the substrate, to substantially hermetically seal the MEMS.

Such an apparatus further optionally comprises the cap being a titanium cap, the substrate being a titanium substrate, the cap is micro laser welded to the substrate using a neodymium-doped yttrium aluminum garnet (Nd:$Y_3Al_5O_{12}$)(Nd:YAG) laser, the Nd:YAG laser being a millisecond pulsed laser type with a wavelength of 1064 nm, wafer level packaging is applied to the apparatus, a temperature of the MEMS remaining below a desired temperature during laser welding of the cap to the substrate, a size of the cap being scalable up to 400 mm by 400 mm. The cap is directly micro-welded to the substrate, therefore the thermal mismatch issue, which is the common problem for current packaging methods, is not be considered in the proposed packaging method.

A method of packaging a micro-electromechanical system (MEMS) in accordance with one or more embodiments of the present invention comprises integrating at least one device to a titanium substrate, and laser welding a thermally matched cap to the substrate to substantially hermetically seal the MEMS.

Such a method further optionally comprises the at least one device being a silicon-based MEMS device, a size of the cap can be scaled up to 400 mm by 400 mm, the MEMS device (silicon and titanium based type) being integrated into a 15 inch by 15 inch square or circular cavity of the titanium substrate, a laser spot size varying from 20 μm to 400 μm in diameter based up on at least one of an application of the MEMS, a MEMS device size, a hermiticity requirement, and a generated heat limit, the packaging being biocompatible, and the MEMS being mounted at a distance from a location of the laser welding, the distance being selected based on at least a temperature gradient in the substrate.

BRIEF DESCRIPTION OF THE DRAWINGS

Referring now to the drawings in which like reference numbers represent corresponding parts throughout:

FIG. 8A illustrates the AFM tip, FIG. 8B illustrates the designed GCT, FIG. 8C illustrates the fabricated GCT, FIG. 8D illustrates the packaged AFM, and FIG. 8E illustrates the resonance frequency of the AFM before and after packaging in accordance with one or more embodiments of the present invention.

DETAILED DESCRIPTION OF THE INVENTION

In the following description of the preferred embodiment, reference is made to the accompanying drawings which form a part hereof, and in which is shown by way of illustration one or more specific embodiments in which the invention may be practiced. It is to be understood that other embodiments may be utilized and structural changes may be made without departing from the scope of the present invention.

Physics of Laser Welding

There have been several numerical and analytical models that have sought to elucidate the physical mechanisms involved in the continuous-wave laser welding process [6-8], but only a few models of pulsed laser welding exist [9]. In order to construct an adequate model of heat flow in pulsed laser welding, it is necessary to understand the physics of the laser welding process.

Figure 1:
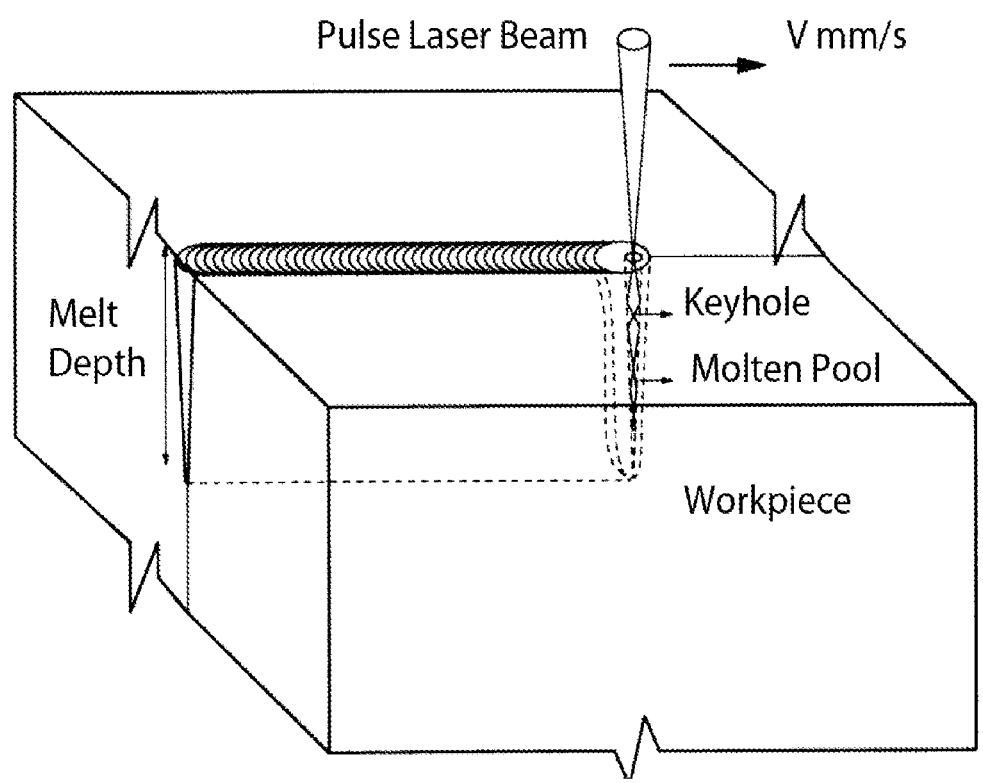
FIG. 1 illustrates movement of a laser beam on a surface of a material according to one or more embodiments of the present invention.

As shown in FIG. 1, when a laser beam is irradiated onto the surface of a material, the absorbed energy causes heating, melting and evaporation of the material depending on the absorbed laser power intensity [10]. Laser welding is performed by moving the focused beam over the surface of the workpiece along the desired contour that separates the two pieces to be joined. If the laser beam intensity is sufficiently high and the scanning speed is not too fast, evaporation throughout the full depth of the workpiece can be obtained and the so called "keyhole" is formed.

This keyhole absorbs a considerable amount of the laser beam power. Thus, the keyhole plays an important role in transferring and distributing the laser energy deep into the material and provokes melt depth [11]. The thickness h of a laser-induced melting layer is an important parameter in pulsed laser interaction with the material surface. It is a key factor for quantifying hermiticity of laser welding. Previous studies on the melt depth of pulsed laser [12] showed that the thickness h is a function of many parameters $$h \propto (I, \tau, \alpha, A, \chi, C, \phi, q, T_m, T_b, T_i, D) \tag{1}$$

where I is the laser intensity, $\tau$ is the pulse duration, $\alpha$ is the absorption coefficient, A is the surface absorptivity, $\chi$ is the thermal diffusivity, C is the specific heat, $\phi$ is the angle of incidence, q is the latent heat of melting, $T_m$ and $T_b$ are the melting and boiling points, $T_i$ is the initial temperature, and D is the laser focal spot size.

Approach and Modeling

One of the approaches of the present invention correlates the melt depth and the generated heat in pulsed laser welding of the MEMS packaging while maintaining a substantially hermetic seal in the packaging, and uses this correlation to optimize h based on minimizing the heat applied to the packaging.

Optimization of the melt depth requires knowledge of the behavior of h over a wide range of the parameters. As a first step, vaporization effects are not considered in simulations of the behavior. Also, in order to simplify the model, effects of the titanium phase changing (solid-liquid and liquid-vapor) is not considered in the simulation. A 3D time and spatial heat flow model is used in COMSOL (multiphysics finite element analysis software) to determine the melt depth and generated heat for various laser parameters such as intensity, pulse duration, pulse frequency, laser focal spot size, and welding speed. The spatial and temporal temperature distribution T(x,y,z,t) satisfies Equation (2) for three-dimensional heat conduction.

$$\frac{\partial}{\partial x}\left(k_x \frac{\partial T}{\partial x}\right) + \frac{\partial}{\partial y}\left(k_y \frac{\partial T}{\partial y}\right) + \frac{\partial}{\partial z}\left(k_z \frac{\partial T}{\partial z}\right) + I = \rho c\left(\frac{\partial T}{\partial t}\right) \tag{2}$$

where $k_x$, $k_y$ and $k_z$ are thermal conductivity in x, y and z directions, I is the generated heat per volume by the pulse laser, $\rho$ is the density of the material.

The pulsed laser was modeled as a 3D dynamic Gaussian heat source as shown by Equation (3)

$$I = \eta(1-R)\frac{8P}{\pi z D^2}\exp\left[-8\left(\frac{(x-x_0)^2}{D^2} + \frac{(y-y_0)^2}{D^2}\right)\right] \times H(t) \tag{3}$$

where $\eta$ is the laser power lost in the fibers and R is the reflectivity of the material the laser is radiated on, P is laser output power, z is the laser absorption depth, D is the laser focal spot diameter, H(t) is a unit step function to represent the laser's pulse, $x_0$ and $y_0$ are the center of the laser spot which can be express by Equation (4)

$$x_0 = vt \text{ or } y_0 = vt \tag{4}$$

where v is the welding speed and t is the pulse laser period.

Figure 2:
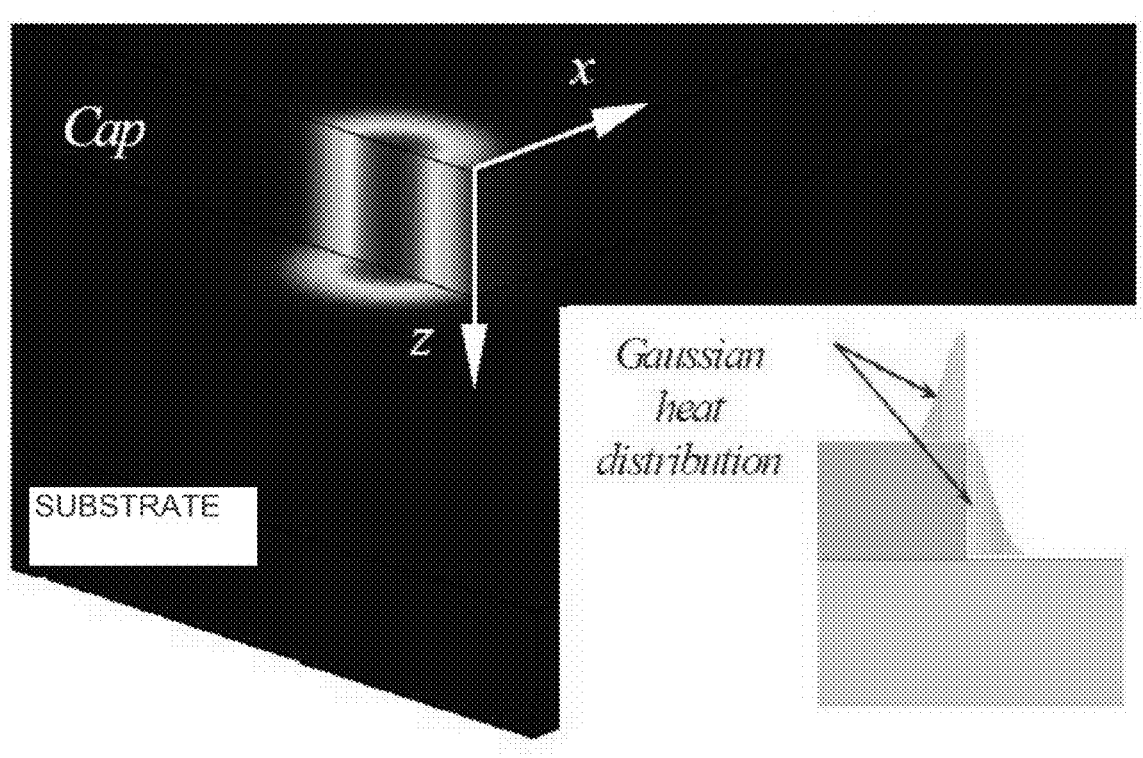
FIG. 2 illustrates that the pulsed laser was modeled as Gaussian heat distribution when a laser beam irradiates a surface of a material according to one or more embodiments of the present invention.

As shown in FIG. 2 by combining Equation (3) and (4), the Gaussian heat source can be moved along the workpiece with the laser beam scanning speed. The pulsed laser is modeled as a three-dimensional Gaussian heat source, which is shown as being evenly distributed on the cap and the substrate in FIG. 2.

Device Level Packaging

In the model shown in FIG. 2, and in several experiments performed as part of the present invention, a MEMS device was mounted on a 10 mm titanium substrate and an 8 mm titanium cap was welded to the substrate. The cap and substrate were taken from a 350 µm titanium wafer, but other wafer thicknesses can be used without departing from the scope of the present invention. The laser system used in this model to generate heat was modeled to be a pulsed laser with a rectangular pulse shape. Typically, such lasers are neodymium-doped yttrium aluminum garnet ($Nd:Y_3Al_5O_{12}$) (Nd:YAG) lasers, and the Nd:YAG laser is also typically a millisecond pulsed laser type with a wavelength of 1064 nm, but other parameters of lasers, pulse-widths, and wavelengths can be used without departing from the scope of the present invention. Therefore, the Gaussian heat source in the simulation was turned on and off at the frequency of the pulse laser. Various laser parameters such as laser intensity, pulse energy and pulse duration were investigated to determine the correlation between the parameters and the melt depth in laser welding. Previous studies on titanium pulsed laser welding showed a linear relationship between the melt depth and laser intensity [13]. The heat generated by increasing laser intensity can be, and typically is, harmful for the mounted MEMS device. Therefore the focus of the present invention was on the other laser parameters in the simulation such as pulse energy, pulse duration and laser focal spot size.

Several experiments were performed and the experimental results were used to calibrate our model. The experimental results showed that for a pulsed laser with a duration of 1.4 ms, a focal size of 350 µm and a frequency of 14 Hz, the minimum pulse energy required to weld the cap to the substrate in a substantially hermetic manner is 1.3 J. Other combinations of duration, focal size, and frequency may be used without departing from the scope of the present invention, and other combinations and minimum pulse energies may be used for different substrates and different caps without departing from the scope of the present invention.

Figure 3:
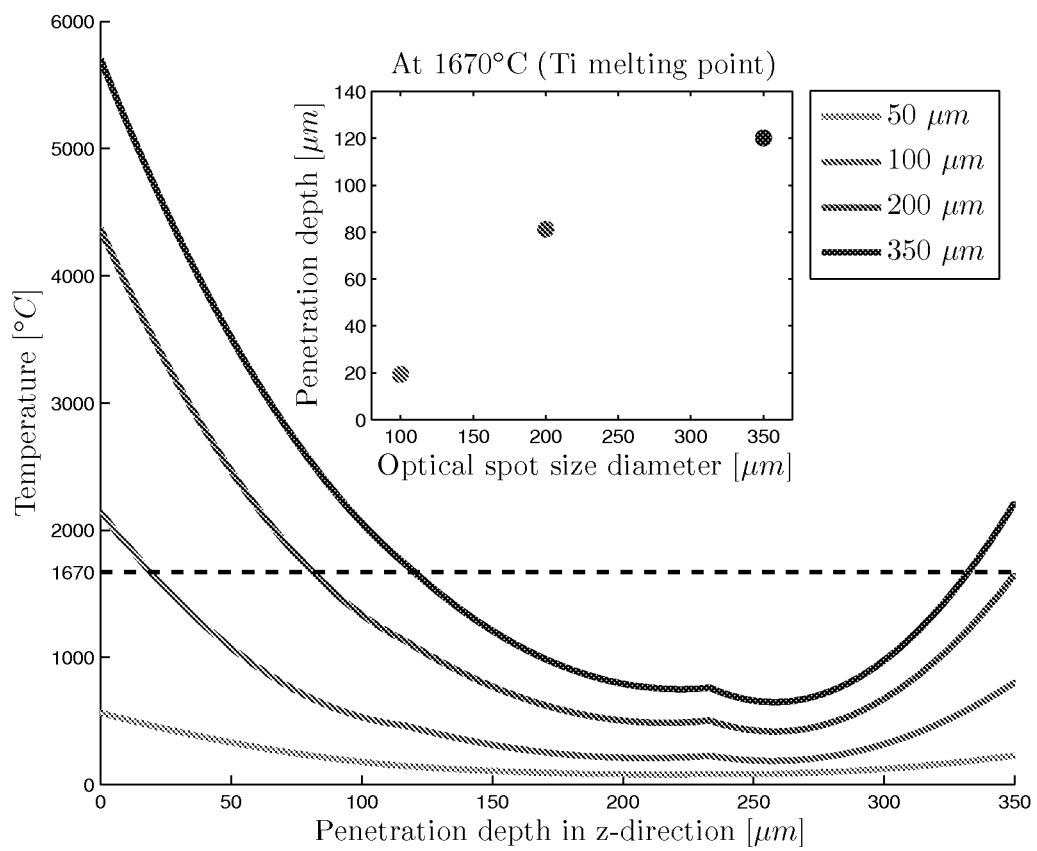
FIG. 3 illustrates a correlation between pulsed laser focal spot size and the melt depth in accordance with one or more embodiments of the present invention.

The simulation results in FIG. 3 reveal that the applied pulsed laser generates a melt depth of 120 µm on the cap. Therefore we can conclude that at a melt depth of 120 µm, the generated molten pool at the cap is big enough to merge with the molten pool created at the substrate. The merged molten pool is solidified after cooling down and the cap is welded to the substrate. As well, FIG. 3 reveals a correlation between the melt depth and laser focal spot size. This result satisfies the prescribed laser focal size in laser welding literature in accordance with the cap thickness [14].

Figure 4:
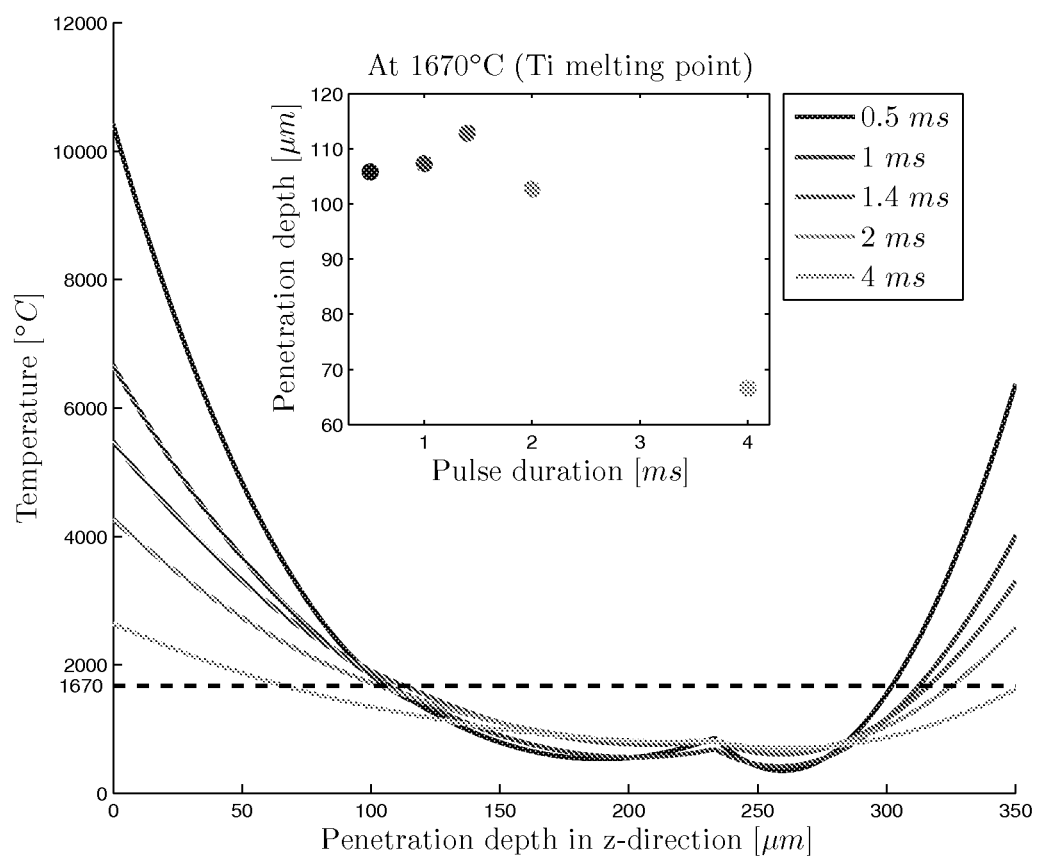
FIG. 4 illustrates a correlation between laser pulse duration and the melt depth in accordance with one or more embodiments of the present invention.

Simulation results in FIG. 4 show a correlation between the melt depth and pulse duration.

Figure 5:
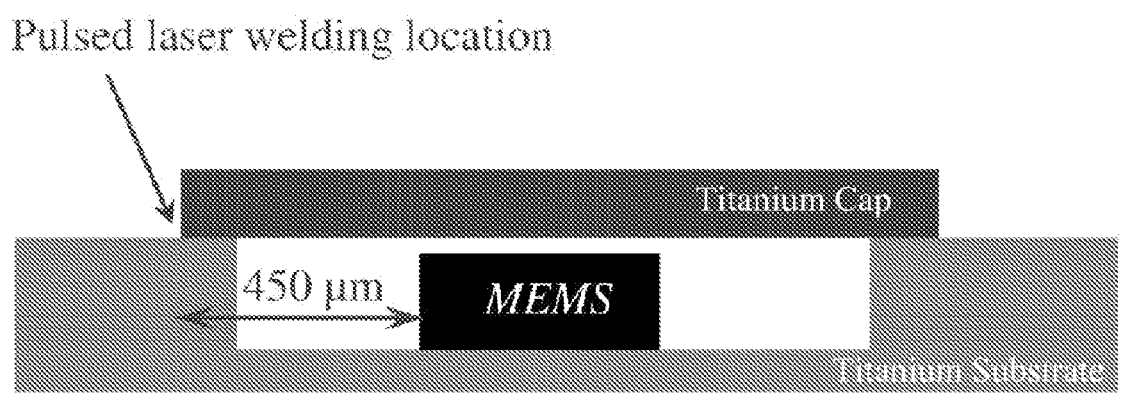
FIG. 5 illustrates a MEMS device mounted with respect to the center of the laser heat source in accordance with one or more embodiments of the present invention.

FIG. 5 illustrates a MEMS device mounted with respect to the center of the laser heat source in accordance with one or more embodiments of the present invention.

Figure 7:
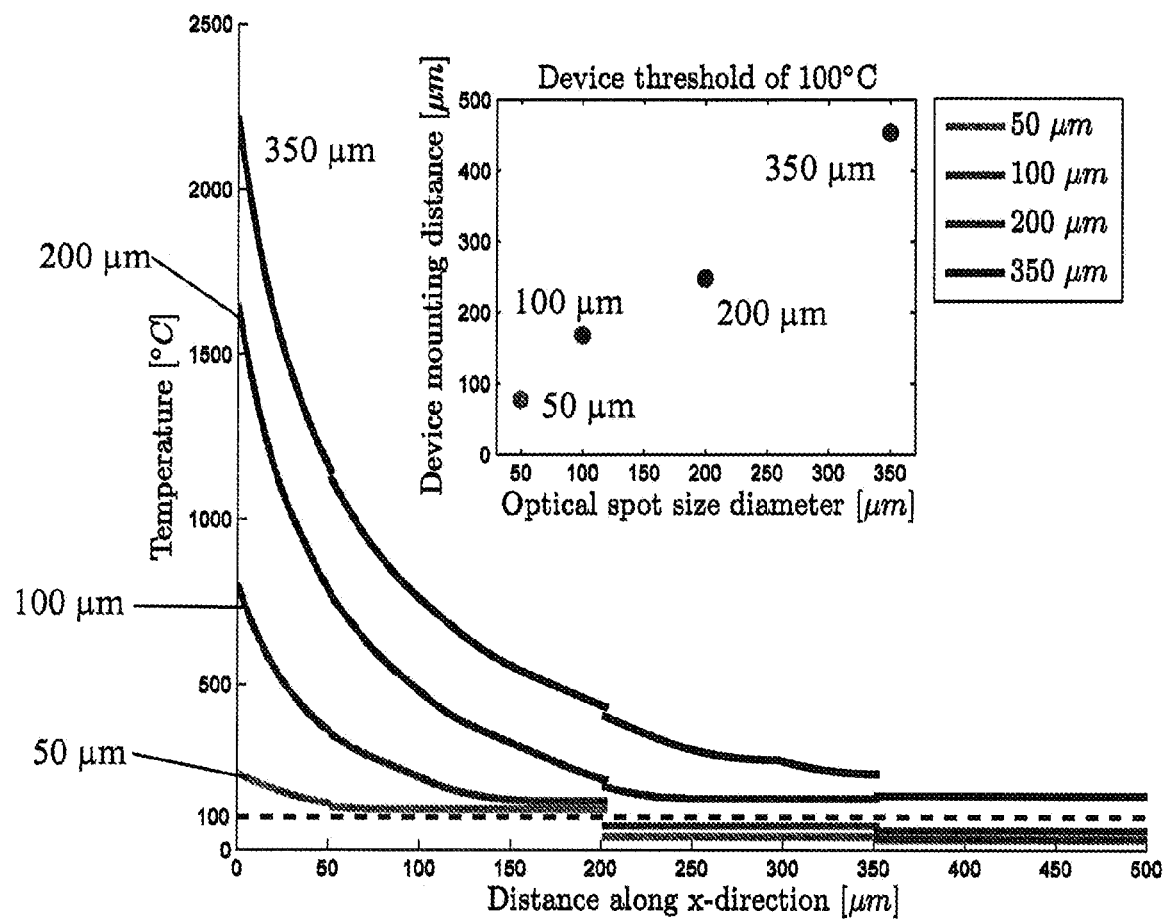
FIG. 7 reveals the temperature gradient in the substrate which determines what distance from the heat source the MEMS device can be mounted in accordance with one or more embodiments of the present invention.

Based on the results shown in FIGS. 3, 4, and 7, the MEMS device can be safely mounted at a distance of 450 µm from the center of the laser heat source using a 350 µm laser focal spot size without heating of the MEMS device beyond a desired temperature, in this case, 100 degrees C. If the MEMS device can withstand a greater temperature during packaging, the MEMS device can be mounted closer to the center of the laser heat source, or different parameters can be used for the laser heat source (pulse duration, laser focal spot size, etc.), without departing from the scope of the present invention.

Figures 6A, 6B, 6C, 6D:
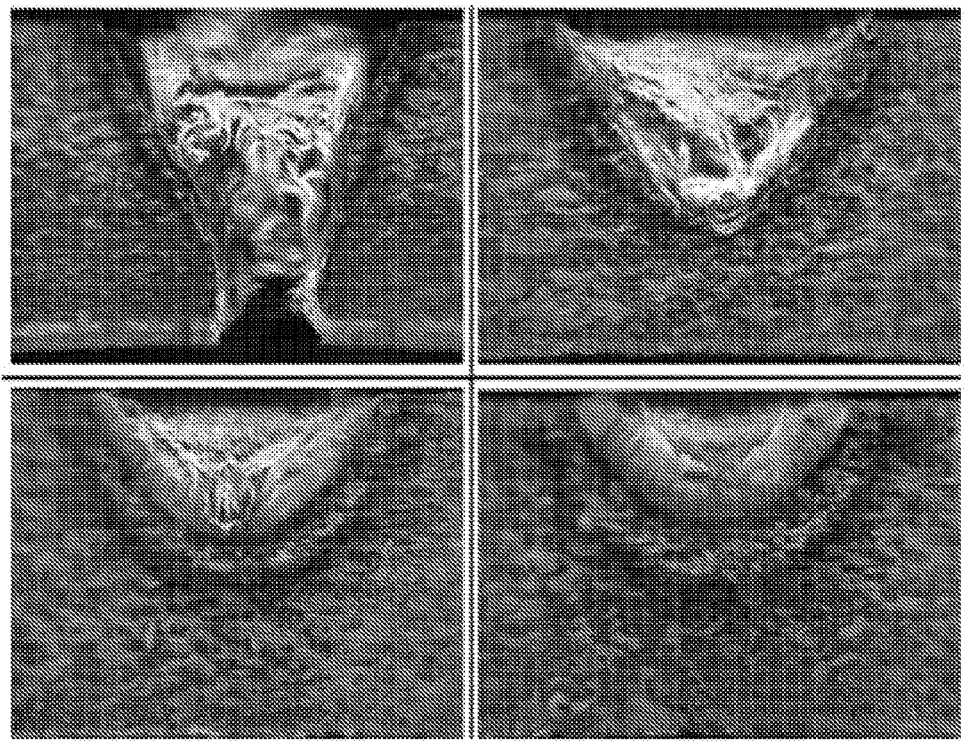
FIGS. 6A-6D reveal the experimental results of the melt depth for the applied laser used in the simulation in accordance with one or more embodiments of the present invention.

FIGS. 6A-6D reveal the experimental results of the melt depth for the applied laser used in the simulation. FIG. 6A shows a pulse duration of 4 ms FIG. 6B shows a pulse duration of 2 ms, FIG. 6C shows a pulse duration of 1.4 ms, and FIG. 6D shows a pulse duration of 1 ms.

Comparison of the experimental results with the simulation shows that the model is valid if the pulse duration is greater than 1 ms. For pulse duration of less than 1 ms, the generated heat vaporizes the titanium cap. As mentioned earlier, the vaporization was not considered in the model and this disparity is expected to be seen.

FIG. 7 reveals the temperature gradient in the substrate which determines what distance from the heat source the MEMS device can be mounted. It can be seen that for the laser with a focal size of 350 µm at a distance of 450 µm from the laser heat source, the temperature on the substrate drops to 100° C. and the MEMS device can be safely mounted beyond this point.

Fabrication and Experimental Results

To verify the proposed packaging method and its functionality on MEMS devices, an AFM tip was packaged on a titanium substrate. The device tested is a self-actuating self-sensing AFM cantilever tip (MPA-41100-S, Veeco Instruments). To communicate with the device, gold-ceramic-titanium (GCT) feedthroughs were designed and fabricated on the substrate. The device was mounted and wire-bonded to GCTs, as shown in FIG. 8. By measuring the resonant frequency and quality factor before and after packaging as shown in FIG. 8, it is determined that the applied technique has no effect on the packaged device or GCT feedthroughs.

The laser system used in this experiment was a Nd:YAG pulsed laser with 1064 nm wavelength. Table 1 shows the laser parameters.

TABLE 1

Pulsed laser parameters.

| Laser Spot | | Seam Welding | |
|---|---|---|---|
| Energy per pulse | 1.3 J | Welding speed | 0.85 mm/s |
| Peak power | 1.3 KW | Focal spot size | 300 µm |
| Pulse duration | 1 ms | Pulse frequency | 14 Hz |

Hermiticity

The hermiticity of the packaged device was measured by helium leaking rate test based on MIL-STD-883E standard. The helium leak detector used in this work was an Alcatel ASM 142, which measured a leaking rate of $3.45 \times 10^{-10}$ atm.cc/s for a volume of 0.18 cm$^3$. FIG. 8A illustrates the AFM tip, FIG. 8B illustrates the designed Gold-Ceramic-Titanium (GCT), FIG. 8C illustrates the fabricated GCT, FIG. 8D illustrates the packaged AFM, and FIG. 8E illustrates the resonance frequency of the AFM before and after packaging in accordance with one or more embodiments of the present invention.

The temperature gradient in the substrate which determines what distance from the heat source the MEMS device can be mounted was empirically and experimentally determined. The results reveal that for the laser with a focal size of 350 µm at a distance of 450 µm from the laser heat source, the temperature on the substrate drops to 100° C. and the MEMS device can be safely mounted beyond this point. Therefore both silicon and titanium based MEMS devices can be safely mounted at a distance of 450 µm from the center of the laser spot, see FIG. 5. If the MEMS device can withstand a higher temperature, or the substrate provides a different temperature gradient than that used in the model and experiments, the MEMS device can be mounted at a distance less than 450 microns from the laser heat source with the same parameters. Further, changing the parameters of the laser heat source may also decrease the distance between the weld and the MEMS device. Such combinations and permutations of substrate temperature gradient, laser parameter changes, and MEMS device heating capacities are contemplated within the scope of the present invention.

Wafer Level Packaging

Wafer level packaging (WLP) refers to the technology of packaging an integrated circuit at wafer level, instead of the traditional process of assembling the package of each individual unit after wafer dicing. WLP is essentially a true chip-scale packaging (CSP) technology, since the resulting package is practically of the same size as the die. WLP has been developed because of its advantages in miniaturizing, thinning and lightening packaged chips, and also for its enabling of a more cost-effective manufacturing solution. As a result, it is an efficient, scalable, easily mapped packaging and assembly solution. Laser diode packaging, device packaging, RF power module assembly and LED matrix assembly are some of the applications accomplished by wafer scale packaging. Each of these applications is a result of common trends of increased miniaturization in packaging and greater productivity demand.

In this section we demonstrate the application of the invented packaging technique on WLP packaging by using titanium as the packaging material. The method applies directly to the titanium cap and substrate with no need of any interface material or films between them. This is considered a main advantage over the current methods. The proposed packaging method is an inexpensive, fast operation, high precision with low thermal distortion, reliable and biocompatible technique for packaging MEMS devices. This technique can be applied to both titanium and silicon MEMS. It can be considered a potential bridge between silicon Bio-MEMS and biotechnology applications.

Figure 9:
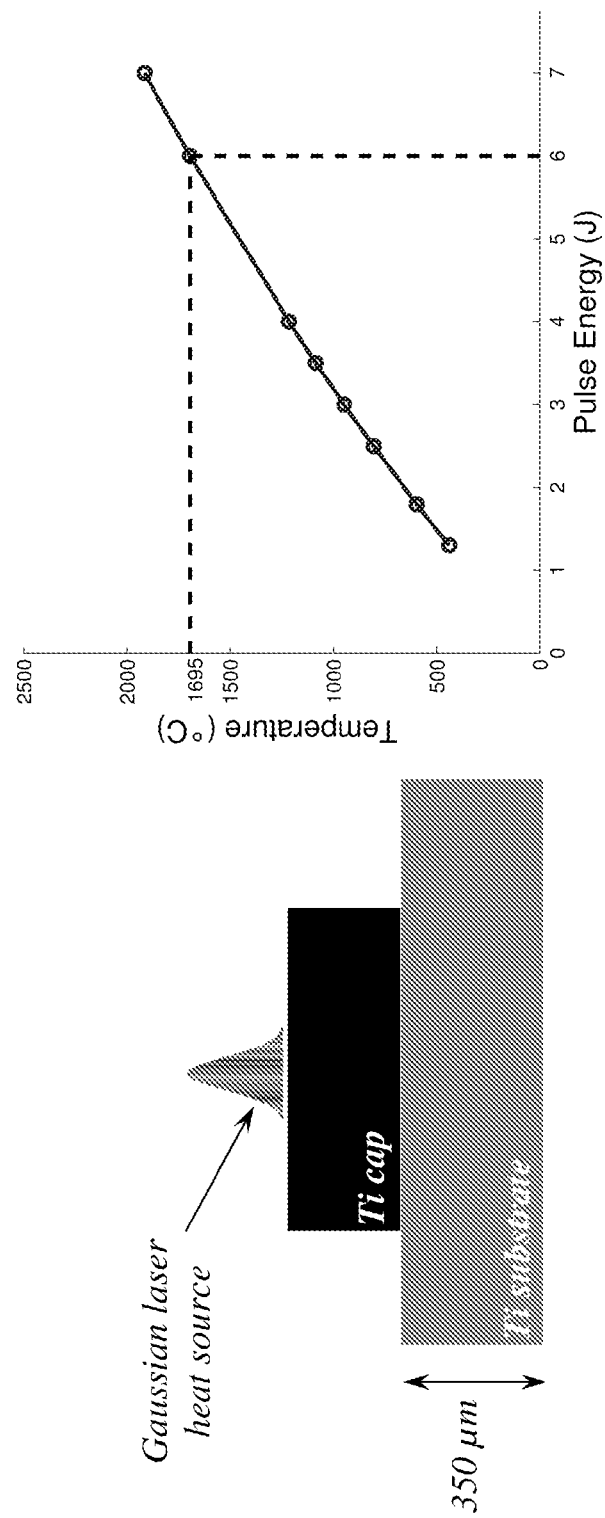
FIG. 9 illustrates simulations on laser welding the titanium cap on the substrate for various pulse energies in accordance with one or more embodiments of the present invention.

Simulations on laser welding the titanium cap on the substrate in FIG. 9 shows a linear relationship between the laser intensity and temperature along the cross-section of the cap and substrate. The titanium cap and substrate are 350 μm thick and the laser focal spot size of the YAG laser is 300 μm, and the pulse duration is 1 ms with a frequency of 14 Hz. The simulation result shows a pulse energy of 6 J is required to melt the substrate at the interface. This pulsed laser generates 6 kW of heat when is radiated on the cap which can cause high thermal distortion on the wafer and can be harmful to any mounted MEMS device on the substrate. Therefore, the geometry of the cap and substrate were studied and optimized in order to avoid thermal distortion and overheating issues in the welding process.

Figure 10:
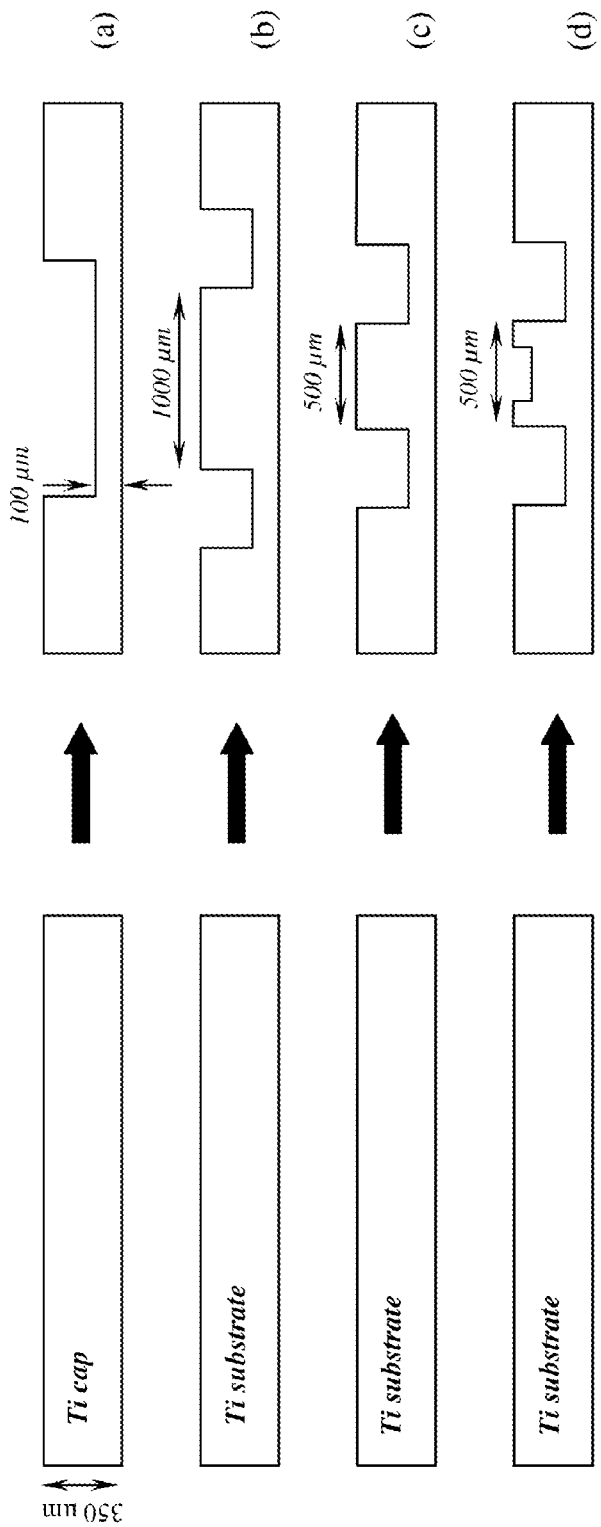
FIGS. 10(a)-10(d) illustrate various bridge geometries for the titanium cap in accordance with one or more embodiments of the present invention.
Figure 11:
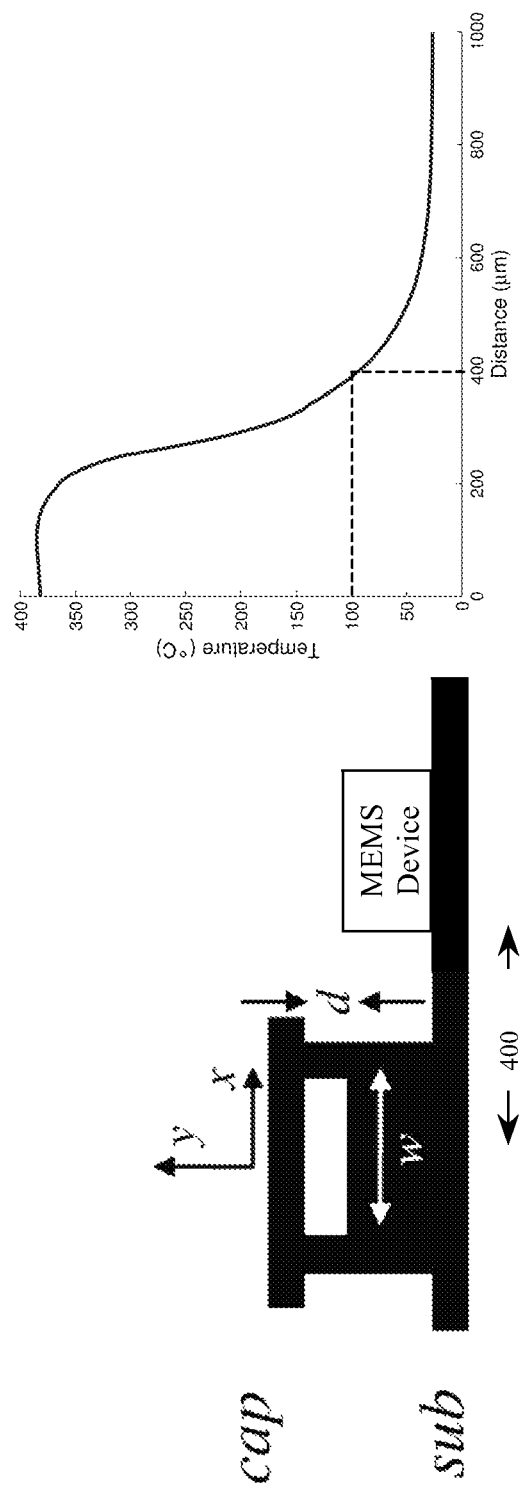
FIG. 11 illustrates a trenched bridge geometry in relation to a mounted MEMS device in accordance with one or more embodiments of the present invention.

In order to balance the melt depth and generated heat, three different bridge geometries are investigated for the substrate at the interface. As shown in FIG. 10(a), the titanium cap thickness is decreased 100 μm at the welding area, and the substrate is either macro-machined or wet etched to fabricate bridge with three different geometries; 1000 μm width ,FIG. 10(b), 500 μm width, FIG. 10(c), and 500μm width with a trench, FIG. 10(d). The simulation results reveal that decreasing the bridge width reduces the laser power required for welding. FIG. 11 shows a pulsed laser with 1.3 J energy and 1 ms pulse duration raises the temperature of the cap and substrate at the interface for the case of the narrow bridge with a trench significantly higher than other cases. The conclusion is that adding a trench reduces the laser power required for welding, thus reducing the unwanted heat transferred to the enclosed MEMS device. From these results, it is expected that a deeper melt depth is achieved on the narrow bridge with a trench for a given pulse laser compared to bridge configurations without a trench.

This approach of the present invention is to minimize the thermal distortion on the titanium wafer and/or substrate. The trench's dimensions are empirically and experimentally determined based upon increasing the melt depth and minimizing the laser pulse energy. FIG. 11(a) shows the optimized dimensions for the trench's width and height on a 300 μm thick titanium cap and substrate, are w=250 μm and d=10 μm respectively. Also, the simulation result in FIG. 11(b) reveals that at a distance of 400 μm from the center of the laser heat source, the temperature on the substrate drops to 100° C. and the MEMS device can be safely mounted beyond this point.

Packaging Processes

Figure 12:
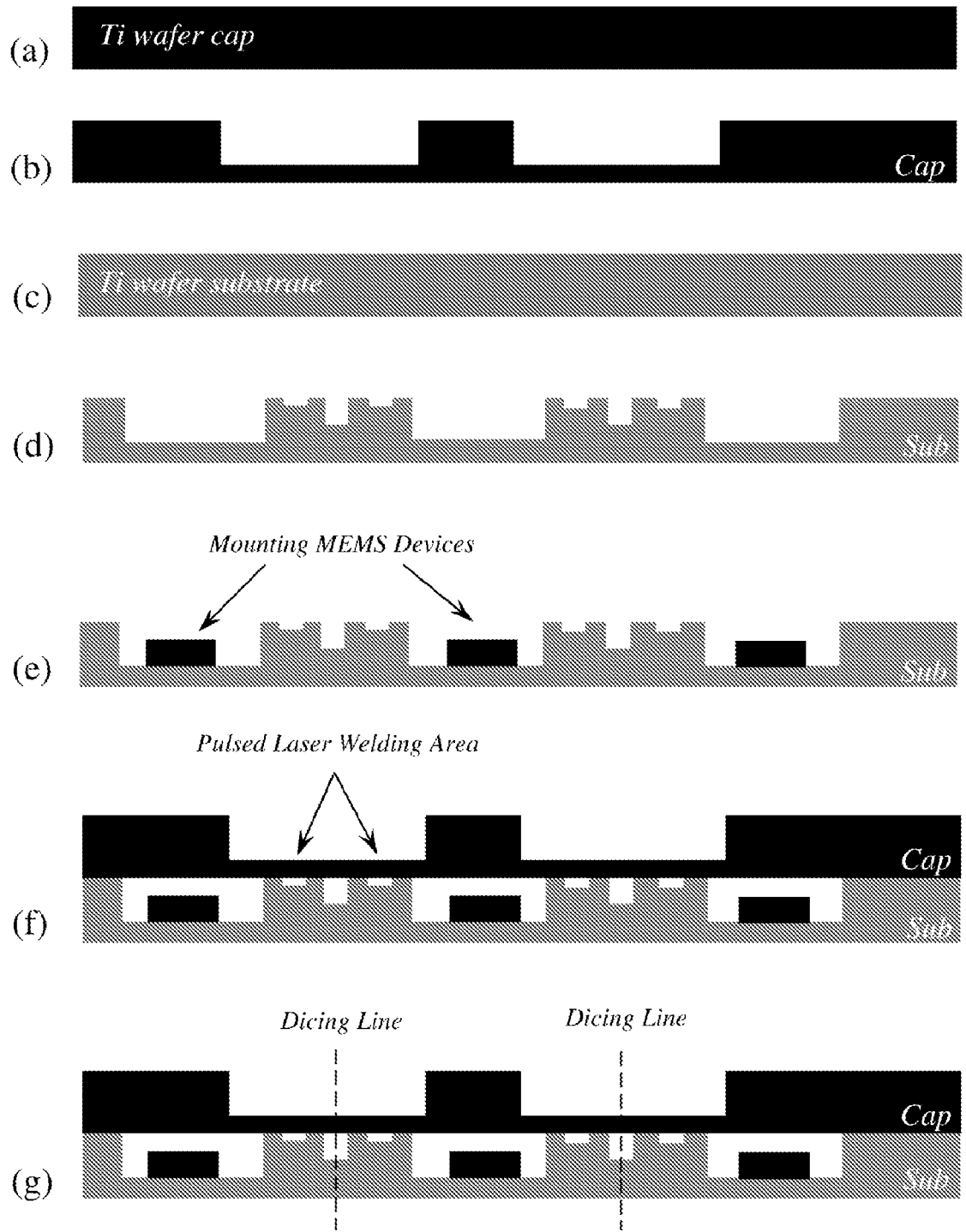
FIGS. 12(a)-12(g) illustrate a packaging process in accordance with one or more embodiments of the present invention.
Figure 13:
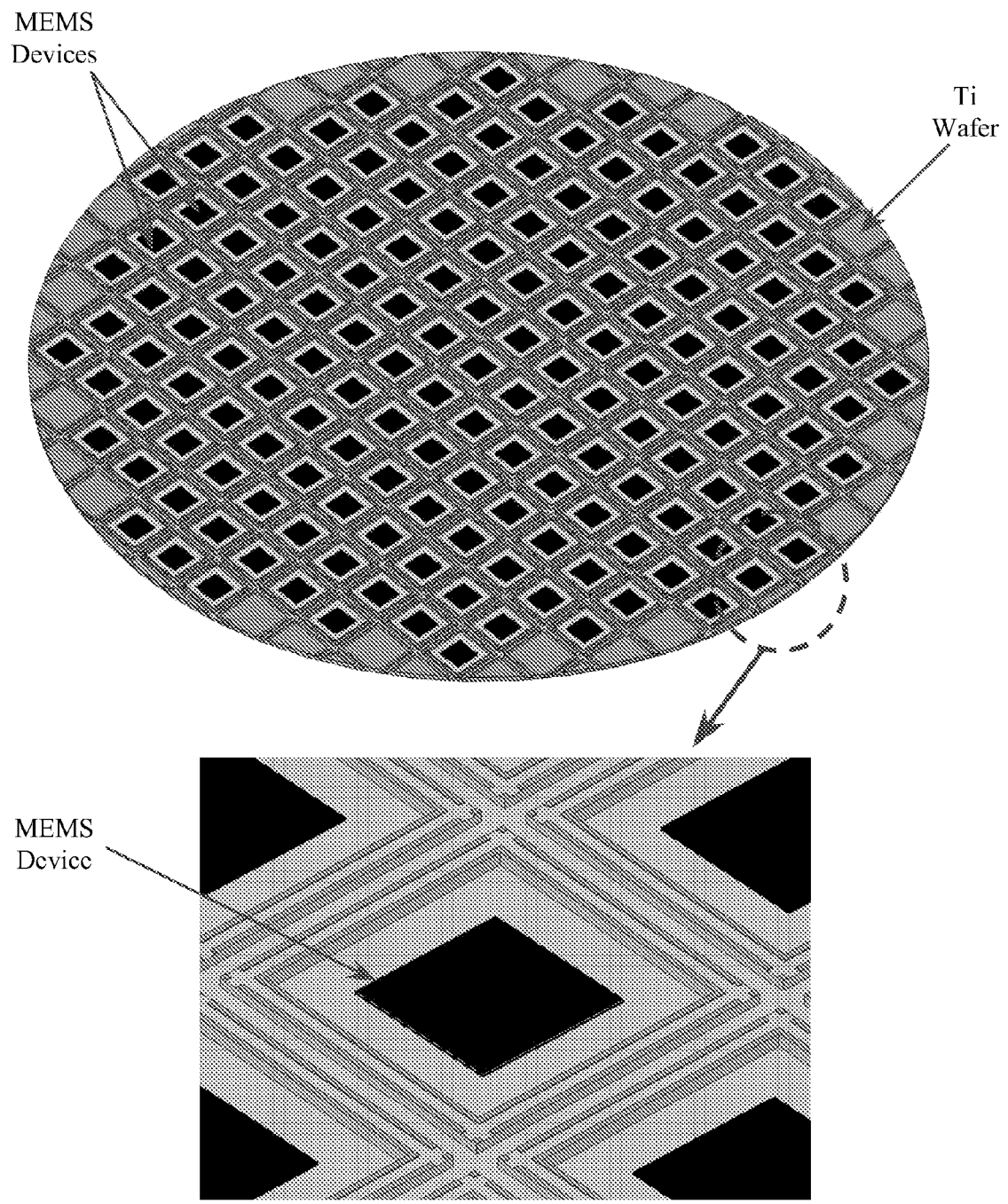
FIG. 13 illustrates perspective and inset views of a packaged MEMS device in accordance with one or more embodiments of the present invention.

A 100 mm titanium wafer with thickness of 300 μm is used as the substrate and cap in this work. FIG. 12 presents the packaging process for both Si-MEMS and Ti-MEMS devices on wafer level packaging. The titanium cap and substrate are either macro-machined or wet etched as shown in FIGS. 12(b) and 12(d) respectively. FIG. 12(e) shows the gold-ceramic-titanium (GCT) feedthroughs are fabricated on the substrate and the MEMS devices are mounted and wire bonded to GCTs. The cap and substrate are placed together firmly using a vacuum chuck. The pulsed laser welding technique is applied to micro weld the cap to the substrate, see FIG. 12(d) and finally the wafer is diced along the dicing lines shown in FIG. 12(g). FIG. 13 shows perspective and inset views of the packaged device.

The present invention is scalable such that wafer-scale processing and packaging can occur. Single chips, diced from a wafer, can be packaged using the present invention, 400 mm by 400 mm devices or entire systems, MEMS or otherwise, can be packaged, as well as entire wafers such as, but not limited to 12 inch wafers mounted or integrated into 15 inch square cavities on the substrate, without departing from the scope of the present invention. Although discussed with respect to square cavities for ease of explanation, other shapes of the cavities, as well as other shapes of the MEMS or other electronics that are used in the present invention, can be used without departing from the scope of the present invention. For example, and not by way of limitation, circular cavities or rectangular cavities may be used depending on the design of the packaging, the heating sensitivities of the system being encapsulated, the hermetic sealing requirements of the packaging and the system, the temperature gradient possible within the substrate, and other parameters.

Process Chart

Figure 14:
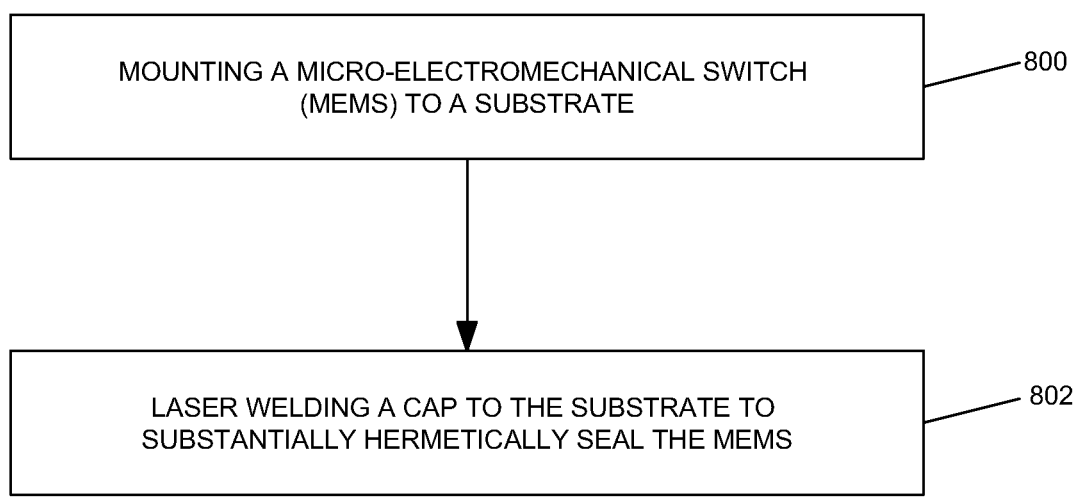
FIG. 14 illustrates a process chart in accordance with one or more embodiments of the present invention.

FIG. 14 illustrates a process chart in accordance with one or more embodiments of the present invention.

Box 800 illustrates mounting a micro-electromechanical switch (MEMS) to a substrate.

Box 802 illustrates laser welding a cap to the substrate to substantially hermetically seal the MEMS.

References

The following references are incorporated herein by reference:

[1] H. Tachibana, K. Kawano, H. Ueda and H. Noge, "Vacuum wafer level packaged two-dimentional optic scanner by anodic bonding", IEEE MEMS 2009, Sorrento, Italy.

[2] J. S. Mitchell and K. Najafi, "A detailed study and reliability for vacuum packages fabricated in a wafer-level Au—Si eutectic bonding process", Transducer 2009, Denver, USA.

[3] M. F. Aimi, M. P. Rao, N. C. Macdonald, A. Zuruzi and D. P. Bothman, "High-aspect-ratio bulk micromachining of titanium", Nature Materials, 3, 103 (2004).

[4] M. J. Donachie Titanium: a technique guide. Metals Park: ASM international; 1984. p. 27-8.

[5] D. Brunette, Titanium in Medicine, Springer, 2001.

[6] H. E. Cline and T. R. Anthony, "Heat treating and melting material with a scanning laser or electron beam", Journal of Applied physics, 48(9): 3895-3900, 1997

[7] P. G. Klemens, "Heat balance and flow condition for electron beam and laser welding", Journal of Applied physics, 47(5): 2165-2174, 1976.

[8] J. Dowden, P. Kapadia and N. Postacioglu, "An analysis of the laser-plasma interaction in laser keyhole welding", Journal of Applied physics, 22(6): 741-749, 1989.

[9] P. R. Vishnu, W. B. Li and K. E. Easterling, "Heat flow model for pulsed welding", Journal of Material Science and Technology, 7(7): 649-659, 1991.

[10] N. B. Dahotre, "Laser Fabrication and Machining of Materials", Springer Scinece, pp. 4-9, 2008.

[11] A. F. H. Kaplan, "A model of deep penetration laser welding base on calculation of the keyhole profile", Journal of Applied Physics, 27:1805-1814, 1994.

[12] V. N. Tokarev and A. F. H. Kaplan, "An analytical modeling of time dependent pulsed laser melting", Journal of Applied Physics, 86:2836-2847, 1999.

[13] P. Bozorgi, C. B. Burgner, Z. Yie, C. Ding, K. L. Turner and N. C. MacDonald, "Application of millisecond pulsed laser on MEMS packaging", Hiltton Head, 2010.

[14] W. Duley, "Laser welding," John Wiley & Sons, 1999.

Conclusion

The packaging and method of the present invention has been modeled, simulated, fabricated and experimentally characterized. The laser parameters have been investigated to optimize the melt depth based on minimizing the generated heat. The method in accordance with one or more embodiments of the present invention is suitable for packaging of the MEMS and electronic devices that are temperature sensitive. The invention further has no substrate and cap surface dependency.

The apparatuses and methods of the present invention do not require the intermediate film layer(s). Therefore the thermal mismatch drawback, which is the main cause of failure for the current MEMS packaging techniques, is not an issue for the invented packaging method.

The method and apparatus in accordance with the present invention allow for scaleability of silicon and titanium based MEMS systems to larger sizes, up to at least 12 inch silicon wafer or 15 inch squares. Prior attempts at reliable packaging techniques for Si-MEMS on this scale have not been reported. Further, the packaging methods of the present invention can assist in the application of Si-MEMS for in vivo applications by integrating them to the titanium substrate and use the methods and apparatuses of the present invention.

The present invention comprises using titanium as a new material for packaging and a YAG millisecond pulsed laser as a localized heat source to introduce a new packaging technique for MEMS on both the wafer and device scale. The present invention overcomes other packaging technique issues such a heat distortion and MEMS device damage from global heating packaging processes. The demonstrated packaging method of the present invention applies directly to the titanium cap and substrate with no need of any interface material or films between them. As such, the present invention has advantages over current methods, as the present invention provides low cost, fast operation and precision with low thermal distortion, as well as reliability and biocompatibility with MEMS devices. The present invention can also be applied to both titanium and silicon MEMS making it a potential bridge between silicon Bio-MEMS and biotechnology applications.

An apparatus in accordance with one or more embodiments of the present invention comprises a substrate, a micro-electro-mechanical system (MEMS), coupled to the substrate, and a cap, laser welded to the substrate, to substantially hermetically seal the MEMS.

Such an apparatus further optionally comprises the cap being a titanium cap, the substrate being a titanium substrate, the cap is micro laser welded to the substrate using a neodymium-doped yttrium aluminum garnet (Nd:$Y_3Al_5O_{12}$)(Nd:YAG) laser, the Nd:YAG laser being a millisecond pulsed laser type with a wavelength of 1064 nm, wafer level packaging is applied to the apparatus, a temperature of the MEMS remaining below a desired temperature during laser welding of the cap to the substrate, a size of the cap being scalable up to 400 mm by 400 mm, and the cap being thermally matched to the substrate.

A method of packaging a micro-electromechanical system (MEMS) in accordance with one or more embodiments of the present invention comprises integrating at least one device to a titanium substrate, and laser welding a thermally matched cap to the substrate to substantially hermetically seal the MEMS.

Such a method further optionally comprises the at least one device being a silicon-based MEMS device, a size of the cap being 400 mm by 400 mm, the MEMS being integrated into a 15 inch by 15 inch square cavity of the titanium substrate, a laser spot size varying from 20 µm to 400 µm in diameter based up on at least one of an application of the MEMS, a MEMS device size, a hermiticity requirement, and a generated heat limit, the packaging being biocompatible, and the MEMS being mounted at a distance from a location of the laser welding, the distance being selected based on at least a temperature gradient in the substrate.

This concludes the description of the preferred embodiment of the present invention. The foregoing description of one or more embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto and the full range of equivalents to the claims appended hereto.

What is claimed is:

1. An apparatus, comprising:
   a titanium substrate;
   a micro-electro-mechanical system (MEMS) device mounted on the substrate; and
   a titanium cap laser welded to the substrate at welding locations so as to hermetically seal the MEMS device;
   wherein:
   a distance between the MEMS device and the welding locations is 450 micrometers or less,
   the welding locations consist essentially of a direct titanium to titanium weld, and
   the cap is welded onto a trench in the substrate.

2. The apparatus of claim 1, wherein the the distance is no more than 85 micrometers from the welding locations.

3. The apparatus of claim 1, wherein the cap is micro laser welded to the substrate using a neodymium-doped yttrium aluminum garnet (Nd:$Y_3Al_5O_{12}$)(Nd:YAG) laser.

4. The apparatus of claim 3, wherein the Nd:YAG laser is a millisecond pulsed laser type with a wavelength of 1064 nm.

5. The apparatus of claim 1, wherein wafer level packaging is applied to the apparatus.

6. The apparatus of claim 1, wherein a size of the cap is scalable up to 400 mm by 400 mm.

7. The apparatus of claim 1, wherein the cap is thermally matched to the substrate.

8. The apparatus of claim 1, wherein:
the MEMS device comprises a cantilever, and
the cap is directly welded to the titanium substrate such that a resonance frequency of the cantilever changes by less than 1% as compared to before the cap is laser welded to the substrate.

9. A method of packaging a micro-electromechanical system (MEMS) device, comprising:
obtaining at least one MEMS device mounted on a titanium substrate; and
laser welding a titanium cap to the titanium substrate, at welding locations, to hermetically seal the at least one MEMS device;
wherein a distance between the at least one MEMS device and the welding locations is 450 micrometers or less.

10. The method of claim 9, wherein the at least one MEMS device is either a silicon-based.

11. The method of claim 9, wherein a size of the cap is less than 400 mm by 400 mm.

12. The method of claim 9, wherein the at least one MEMS device can be integrated into a cavity of the titanium substrate that is less than 15 inch by 15 inch square.

13. The method of claim 9, wherein the laser welding:
uses a laser spot size greater than 20 μm and less than 400 μm in diameter, and
use a laser power of at least 650 Watts.

14. The method of claim 9, wherein a packaging, comprising the titanium substrate and the cap, is biocompatible.

15. The method of claim 9, wherein the at least one MEMS device is mounted at the distance of no more than 85 micrometers form the welding locations, the method further comprising selecting the distance based on at least a temperature gradient in the substrate.

16. The method of claim 15, wherein the laser welding uses at least one laser parameter selected from a laser pulse frequency, a laser pulse energy, a laser pulse duration, and a laser pulse size, the method further comprising selecting the distance based on:
the at least one laser parameter, and
a geometry and configuration of an interface between the substrate and the cap.

17. The method of claim 15, wherein the laser welding uses an yttrium aluminum garnet laser and and an interface film is not deposited between the substrate and the cap at the welding locations prior to the laser welding.

18. The method of claim 9, further comprising selecting a geometry of the substrate at the welding locations, based on a target temperature at a location where the at least one MEMS device is mounted.

19. The method of claim 18, further comprising forming a trench in the substrate, wherein:
the cap is laser welded on the trench,
the trench's width is selected so as to reduce thermal distortion and reduce laser power used during the laser welding, and
the laser welding directly welds the titanium in the substrate to the titanium in the cap.

* * * * *